United States Patent
Rogers et al.

(10) Patent No.: US 11,476,145 B2
(45) Date of Patent: Oct. 18, 2022

(54) AUTOMATIC ESC BIAS COMPENSATION WHEN USING PULSED DC BIAS

(71) Applicant: Applied Materials, Inc., Santa Clara, CA (US)

(72) Inventors: James Rogers, Los Gatos, CA (US); Linying Cui, Cupertino, CA (US); Leonid Dorf, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 792 days.

(21) Appl. No.: 16/197,006

(22) Filed: Nov. 20, 2018

(65) Prior Publication Data

US 2020/0161155 A1 May 21, 2020

(51) Int. Cl.
*H01L 21/683* (2006.01)
*H01J 37/32* (2006.01)
*H01J 37/248* (2006.01)

(52) U.S. Cl.
CPC ........ *H01L 21/6833* (2013.01); *H01J 37/248* (2013.01); *H01J 37/32146* (2013.01); *H01J 37/32917* (2013.01)

(58) Field of Classification Search
CPC ................. H01J 37/32; H01J 37/32009; H01J 37/32018; H01J 37/32027; H01L 21/02; H01L 21/67; H01L 21/683; H01L 21/6831; H01L 21/6833; C23C 14/14; C23C 14/34; C23C 16/455; H01H 3/00; H02N 13/00
USPC ................................................ 361/233, 234
See application file for complete search history.

(56) References Cited

U.S. PATENT DOCUMENTS

| | | | |
|---|---|---|---|
| 4,070,589 A | 1/1978 | Martinkovic |
| 4,340,462 A | 7/1982 | Koch |
| 4,464,223 A | 8/1984 | Gorin |
| 4,504,895 A | 3/1985 | Steigerwald |
| 4,585,516 A | 4/1986 | Corn et al. |

(Continued)

FOREIGN PATENT DOCUMENTS

| | | |
|---|---|---|
| CN | 101990353 A | 3/2011 |
| CN | 102084024 A | 6/2011 |

(Continued)

OTHER PUBLICATIONS

ELECTRICAL 4 U webpage—"Clamping Circuit," Aug. 29, 2018, 1 page.

(Continued)

*Primary Examiner* — Jue Zhang
(74) *Attorney, Agent, or Firm* — Patterson + Sheridan, LLP

(57) ABSTRACT

Disclosed herein is a system for pulsed DC biasing and clamping a substrate. The system can include a plasma chamber having an ESC for supporting a substrate. An electrode is embedded in the ESC and is electrically coupled to a biasing and clamping circuit. The biasing and clamping circuit includes at least a shaped DC pulse voltage source and a clamping network. The clamping network includes a DC voltage source and a diode, and a resistor. The shaped DC pulse voltage source and the clamping network are connected in parallel. The biasing and clamping network automatically maintains a substantially constant clamping voltage, which is a voltage drop across the electrode and the substrate when the substrate is biased with pulsed DC voltage, leading to improved clamping of the substrate.

20 Claims, 7 Drawing Sheets

(56) References Cited

U.S. PATENT DOCUMENTS

| | | | |
|---|---|---|---|
| 4,683,529 A | 7/1987 | Bucher, II | |
| 4,931,135 A | 6/1990 | Horiuchi et al. | |
| 4,992,919 A | 2/1991 | Lee et al. | |
| 5,099,697 A | 3/1992 | Agar | |
| 5,140,510 A | 8/1992 | Myers | |
| 5,242,561 A | 9/1993 | Sato | |
| 5,449,410 A | 9/1995 | Chang et al. | |
| 5,451,846 A | 9/1995 | Peterson et al. | |
| 5,464,499 A | 11/1995 | Moslehi et al. | |
| 5,554,959 A | 9/1996 | Tang | |
| 5,565,036 A | 10/1996 | Westendorp et al. | |
| 5,595,627 A | 1/1997 | Inazawa et al. | |
| 5,597,438 A | 1/1997 | Grewal et al. | |
| 5,610,452 A | 3/1997 | Shimer et al. | |
| 5,698,062 A | 12/1997 | Sakamoto et al. | |
| 5,716,534 A | 2/1998 | Tsuchiya et al. | |
| 5,770,023 A | 6/1998 | Sellers | |
| 5,796,598 A | 8/1998 | Nowak et al. | |
| 5,810,982 A | 9/1998 | Sellers | |
| 5,830,330 A | 11/1998 | Lantsman | |
| 5,882,424 A | 3/1999 | Taylor et al. | |
| 5,928,963 A | 7/1999 | Koshiishi | |
| 5,933,314 A * | 8/1999 | Lambson | H01L 21/6833 |
| | | | 361/234 |
| 5,935,373 A | 8/1999 | Koshimizu | |
| 5,948,704 A | 9/1999 | Benjamin et al. | |
| 5,997,687 A | 12/1999 | Koshimizu | |
| 6,043,607 A | 3/2000 | Roderick | |
| 6,051,114 A | 4/2000 | Yao et al. | |
| 6,055,150 A | 4/2000 | Clinton et al. | |
| 6,074,518 A | 6/2000 | Imafuku et al. | |
| 6,089,181 A | 7/2000 | Suemasa et al. | |
| 6,099,697 A | 8/2000 | Hausmann | |
| 6,110,287 A | 8/2000 | Arai et al. | |
| 6,117,279 A | 9/2000 | Smolanoff et al. | |
| 6,125,025 A * | 9/2000 | Howald | H01L 21/6833 |
| | | | 361/234 |
| 6,133,557 A | 10/2000 | Kawanabe et al. | |
| 6,136,387 A | 10/2000 | Koizumi | |
| 6,187,685 B1 | 2/2001 | Hopkins et al. | |
| 6,197,151 B1 | 3/2001 | Kaji et al. | |
| 6,198,616 B1 * | 3/2001 | Dahimene | H01L 21/6831 |
| | | | 279/128 |
| 6,201,208 B1 | 3/2001 | Wendt et al. | |
| 6,214,162 B1 | 4/2001 | Koshimizu | |
| 6,232,236 B1 | 5/2001 | Shan et al. | |
| 6,252,354 B1 | 6/2001 | Collins et al. | |
| 6,253,704 B1 | 7/2001 | Savas | |
| 6,277,506 B1 | 8/2001 | Okamoto | |
| 6,309,978 B1 | 10/2001 | Donohoe et al. | |
| 6,313,583 B1 | 11/2001 | Arita et al. | |
| 6,313,612 B1 | 11/2001 | Honda et al. | |
| 6,355,992 B1 | 3/2002 | Via | |
| 6,358,573 B1 | 3/2002 | Raoux et al. | |
| 6,367,413 B1 | 4/2002 | Sill et al. | |
| 6,384,403 B1 | 5/2002 | Guillot et al. | |
| 6,392,187 B1 | 5/2002 | Johnson | |
| 6,395,641 B2 | 5/2002 | Savas | |
| 6,413,358 B2 | 7/2002 | Donohoe | |
| 6,423,192 B1 * | 7/2002 | Wada | C23C 14/046 |
| | | | 204/192.12 |
| 6,433,297 B1 | 8/2002 | Kojima et al. | |
| 6,435,131 B1 | 8/2002 | Koizumi | |
| 6,441,772 B1 | 8/2002 | Hellsten et al. | |
| 6,451,389 B1 | 9/2002 | Amann et al. | |
| 6,456,010 B2 | 9/2002 | Yamakoshi et al. | |
| 6,483,731 B1 | 11/2002 | Isurin et al. | |
| 6,522,076 B2 * | 2/2003 | Goedicke | H01J 37/3405 |
| | | | 204/192.12 |
| 6,535,785 B2 | 3/2003 | Johnson et al. | |
| 6,621,674 B1 | 9/2003 | Zahringer et al. | |
| 6,664,739 B1 | 12/2003 | Kishinevsky et al. | |
| 6,733,624 B2 | 5/2004 | Koshiishi et al. | |
| 6,740,842 B2 | 5/2004 | Johnson et al. | |
| 6,741,446 B2 | 5/2004 | Ennis | |
| 6,777,037 B2 | 8/2004 | Sumiya et al. | |
| 6,808,607 B2 | 10/2004 | Christie | |
| 6,818,103 B1 | 11/2004 | Scholl et al. | |
| 6,818,257 B2 | 11/2004 | Amann et al. | |
| 6,830,595 B2 | 12/2004 | Reynolds, III | |
| 6,830,650 B2 | 12/2004 | Roche et al. | |
| 6,849,154 B2 | 2/2005 | Nagahata et al. | |
| 6,861,373 B2 | 3/2005 | Aoki et al. | |
| 6,863,020 B2 | 3/2005 | Mitrovic et al. | |
| 6,896,775 B2 | 5/2005 | Chistyakov | |
| 6,902,646 B2 | 6/2005 | Mahoney et al. | |
| 6,917,204 B2 | 7/2005 | Mitrovic et al. | |
| 6,947,300 B2 | 9/2005 | Pai et al. | |
| 6,962,664 B2 | 11/2005 | Mitrovic | |
| 6,970,042 B2 | 11/2005 | Glueck | |
| 6,972,524 B1 | 12/2005 | Marakhtanov et al. | |
| 7,016,620 B2 | 3/2006 | Maess et al. | |
| 7,046,088 B2 | 5/2006 | Ziegler | |
| 7,059,267 B2 | 6/2006 | Hedberg et al. | |
| 7,104,217 B2 | 9/2006 | Himori et al. | |
| 7,115,185 B1 | 10/2006 | Gonzalez et al. | |
| 7,126,808 B2 | 10/2006 | Koo et al. | |
| 7,147,759 B2 | 12/2006 | Chistyakov | |
| 7,151,242 B2 | 12/2006 | Schuler | |
| 7,166,233 B2 | 1/2007 | Johnson et al. | |
| 7,183,177 B2 | 2/2007 | Al-Bayati et al. | |
| 7,206,189 B2 | 4/2007 | Reynolds, III | |
| 7,218,503 B2 | 5/2007 | Howald | |
| 7,218,872 B2 | 5/2007 | Shimomura | |
| 7,226,868 B2 | 6/2007 | Mosden et al. | |
| 7,265,963 B2 | 9/2007 | Hirose | |
| 7,274,266 B2 | 9/2007 | Kirchmeier | |
| 7,305,311 B2 | 12/2007 | van Zyl | |
| 7,312,974 B2 | 12/2007 | Kuchimachi | |
| 7,408,329 B2 | 8/2008 | Wiedemuth et al. | |
| 7,415,940 B2 | 8/2008 | Koshimizu et al. | |
| 7,440,301 B2 | 10/2008 | Kirchmeier et al. | |
| 7,452,443 B2 | 11/2008 | Gluck et al. | |
| 7,479,712 B2 | 1/2009 | Richert | |
| 7,509,105 B2 | 3/2009 | Ziegler | |
| 7,512,387 B2 | 3/2009 | Glueck | |
| 7,535,688 B2 | 5/2009 | Yokouchi et al. | |
| 7,586,099 B2 | 9/2009 | Eyhorn et al. | |
| 7,586,210 B2 | 9/2009 | Wiedemuth et al. | |
| 7,588,667 B2 | 9/2009 | Cerio, Jr. | |
| 7,601,246 B2 | 10/2009 | Kim et al. | |
| 7,609,740 B2 | 10/2009 | Glueck | |
| 7,618,686 B2 | 11/2009 | Colpo | |
| 7,633,319 B2 | 12/2009 | Arai | |
| 7,645,341 B2 | 1/2010 | Kennedy et al. | |
| 7,651,586 B2 | 1/2010 | Moriya et al. | |
| 7,652,901 B2 | 1/2010 | Kirchmeier et al. | |
| 7,692,936 B2 | 4/2010 | Richter | |
| 7,700,474 B2 | 4/2010 | Cerio, Jr. | |
| 7,705,676 B2 | 4/2010 | Kirchmeier et al. | |
| 7,706,907 B2 | 4/2010 | Hiroki | |
| 7,718,538 B2 | 5/2010 | Kim et al. | |
| 7,740,704 B2 | 6/2010 | Strang | |
| 7,758,764 B2 | 7/2010 | Dhindsa et al. | |
| 7,761,247 B2 | 7/2010 | van Zyl | |
| 7,782,100 B2 | 8/2010 | Steuber et al. | |
| 7,791,912 B2 | 9/2010 | Walde | |
| 7,795,817 B2 | 9/2010 | Nitschke | |
| 7,808,184 B2 * | 10/2010 | Chistyakov | H01J 37/3408 |
| | | | 315/111.41 |
| 7,821,767 B2 | 10/2010 | Fujii | |
| 7,825,719 B2 | 11/2010 | Roberg et al. | |
| 7,858,533 B2 | 12/2010 | Liu et al. | |
| 7,888,240 B2 | 2/2011 | Hamamjy et al. | |
| 7,898,238 B2 | 3/2011 | Wiedemuth et al. | |
| 7,929,261 B2 | 4/2011 | Wiedemuth | |
| RE42,362 E | 5/2011 | Schuler | |
| 7,977,256 B2 | 7/2011 | Liu et al. | |
| 7,988,816 B2 | 8/2011 | Koshiishi et al. | |
| 7,995,313 B2 | 8/2011 | Nitschke | |
| 8,044,595 B2 | 10/2011 | Nitschke | |
| 8,052,798 B2 | 11/2011 | Moriya et al. | |
| 8,055,203 B2 | 11/2011 | Choueiry et al. | |

(56) References Cited

U.S. PATENT DOCUMENTS

| | | |
|---|---|---|
| 8,083,961 B2 | 12/2011 | Chen et al. |
| 8,089,026 B2 * | 1/2012 | Sellers ............ H01J 37/32082 |
| | | 219/121.57 |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Katsuda et al. |
| 8,685,267 B2 | 4/2014 | Katsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |

(56) References Cited

U.S. PATENT DOCUMENTS

| | | |
|---|---|---|
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grade et al. |
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapi 70nski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 * | 2/2020 | Dorf .................. C23C 14/3485 |
| 10,580,620 B2 | 3/2020 | Carducci et al. |
| 10,593,519 B2 | 3/2020 | Kamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0112536 A1 | 6/2004 | Quon |
| 2004/0124077 A1 * | 7/2004 | Christie .............. H01J 37/3405 204/192.12 |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |

(56) References Cited

U.S. PATENT DOCUMENTS

| | | |
|---|---|---|
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima |
| 2009/0133839 A1 | 5/2009 | Yamazawa et al. |
| 2009/0236214 A1 | 9/2009 | Janakiraman et al. |
| 2009/0295295 A1* | 12/2009 | Shannon .......... H05H 1/36 315/111.21 |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1* | 10/2011 | Brouk .......... H01J 37/32082 216/61 |
| 2011/0281438 A1 | 11/2011 | Lee et al. |
| 2011/0298376 A1 | 12/2011 | Kanegae |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman |
| 2012/0319584 A1 | 12/2012 | Brouk et al. |
| 2013/0059448 A1 | 3/2013 | Marakhtanov |
| 2013/0087447 A1* | 4/2013 | Bodke .......... C23C 14/046 204/192.15 |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0223112 A1* | 8/2013 | Damazio-Coelho .... H02M 1/32 363/55 |
| 2013/0340938 A1 | 12/2013 | Tappan et al. |
| 2013/0344702 A1 | 12/2013 | Nishizuka |
| 2014/0057447 A1 | 2/2014 | Yang |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1* | 5/2014 | Finley .......... H01J 37/32064 315/172 |
| 2014/0117872 A1* | 5/2014 | Finley .......... H02H 3/087 315/287 |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0231243 A1* | 8/2014 | Finley .......... H01J 37/3444 204/192.12 |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Kamada et al. |
| 2014/0356984 A1 | 12/2014 | Ventzek et al. |
| 2014/0361690 A1* | 12/2014 | Yamada .......... H01J 37/32091 315/111.21 |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1* | 12/2016 | Long .......... H01J 37/32935 |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |

(56) References Cited

U.S. PATENT DOCUMENTS

| | | |
|---|---|---|
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1* | 3/2018 | Wang ............... H01L 21/02274 |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157041 A1 | 5/2019 | Zyl et al. |
| 2019/0157042 A1 | 5/2019 | Van Zyl et al. |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0259562 A1 | 8/2019 | Dorf et al. |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0227230 A1 | 7/2020 | Ziemba et al. |
| 2020/0227289 A1 | 7/2020 | Song et al. |
| 2020/0234922 A1 | 7/2020 | Dorf |
| 2020/0234923 A1 | 7/2020 | Dorf |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0272775 A1 | 9/2021 | Koshimizu |
| 2021/0288582 A1 | 9/2021 | Ziemba et al. |

FOREIGN PATENT DOCUMENTS

| | | |
|---|---|---|
| CN | 101707186 B | 2/2012 |
| CN | 105408993 A | 3/2016 |
| CN | 106206234 A | 12/2016 |
| CN | 104752134 B | 2/2017 |
| EP | 665306 A1 | 8/1995 |
| EP | 983394 A1 | 3/2000 |
| EP | 1119033 A1 | 7/2001 |
| EP | 1203441 A1 | 5/2002 |
| EP | 1214459 A1 | 6/2002 |
| EP | 1418670 A1 | 5/2004 |
| EP | 1691481 A1 | 8/2006 |
| EP | 1701376 A1 | 9/2006 |
| EP | 1708239 A1 | 10/2006 |
| EP | 1780777 A1 | 5/2007 |
| EP | 1852959 A1 | 11/2007 |
| EP | 2016610 A1 | 1/2009 |
| EP | 2096679 A1 | 9/2009 |
| EP | 2221614 A1 | 8/2010 |
| EP | 2541584 A1 | 1/2013 |
| EP | 2580368 A1 | 4/2013 |
| EP | 2612544 A1 | 7/2013 |
| EP | 2838112 A1 | 2/2015 |
| EP | 2991103 A1 | 3/2016 |
| EP | 3086359 A1 | 10/2016 |
| EP | 3396700 A1 | 10/2018 |
| EP | 3616234 A1 | 3/2020 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 4418424 B2 | 2/2010 |
| JP | 2011035266 A | 2/2011 |
| JP | 5018244 B2 | 9/2012 |

(56) References Cited

FOREIGN PATENT DOCUMENTS

| | | |
|---|---|---|
| JP | 2014112644 A | 6/2014 |
| JP | 2016-225439 A | 12/2016 |
| JP | 6741461 B2 | 8/2020 |
| KR | 100757347 B1 | 9/2007 |
| KR | 10-2007-0098556 A | 10/2007 |
| KR | 20160042429 A | 4/2016 |
| KR | 20200036947 A | 4/2020 |
| TW | 498706 B | 8/2002 |
| TW | 201717247 A | 5/2017 |
| WO | 1998053116 A1 | 11/1998 |
| WO | 2000017920 A1 | 3/2000 |
| WO | 2000030147 A1 | 5/2000 |
| WO | 2000063459 A1 | 10/2000 |
| WO | 2001005020 A1 | 1/2001 |
| WO | 2001012873 A1 | 2/2001 |
| WO | 2001013402 A1 | 2/2001 |
| WO | 2002052628 A1 | 7/2002 |
| WO | 2002054835 A2 | 7/2002 |
| WO | 2002059954 A1 | 8/2002 |
| WO | 2003037497 A2 | 5/2003 |
| WO | 2003052882 A2 | 6/2003 |
| WO | 2003054911 A2 | 7/2003 |
| WO | 2003077414 A2 | 9/2003 |
| WO | 2004084394 A1 | 9/2004 |
| WO | 2005124844 A1 | 12/2005 |
| WO | 2007118042 A2 | 10/2007 |
| WO | 2008016747 A2 | 2/2008 |
| WO | 2008050619 A1 | 5/2008 |
| WO | 2008061775 A1 | 5/2008 |
| WO | 2008061784 A1 | 5/2008 |
| WO | 2008062663 A1 | 5/2008 |
| WO | 2009012804 A1 | 1/2009 |
| WO | 2009069670 A1 | 6/2009 |
| WO | 2009111473 A2 | 9/2009 |
| WO | 2011073093 A1 | 6/2011 |
| WO | 2011087984 A2 | 7/2011 |
| WO | 2011156055 A1 | 12/2011 |
| WO | 2012030500 A1 | 3/2012 |
| WO | 2012109159 A1 | 8/2012 |
| WO | 2012122064 A1 | 9/2012 |
| WO | 2013000918 A1 | 1/2013 |
| WO | 2013016619 A1 | 1/2013 |
| WO | 2013084459 A1 | 6/2013 |
| WO | 2013088677 A1 | 6/2013 |
| WO | 2013099133 A1 | 7/2013 |
| WO | 2013114882 A1 | 8/2013 |
| WO | 2013118660 A1 | 8/2013 |
| WO | 2013125523 A1 | 8/2013 |
| WO | 2013187218 A1 | 12/2013 |
| WO | 2014035889 A1 | 3/2014 |
| WO | 2014035894 A1 | 3/2014 |
| WO | 2014035897 A1 | 3/2014 |
| WO | 2014036000 A1 | 3/2014 |
| WO | 2014124857 A2 | 8/2014 |
| WO | 2014197145 A1 | 12/2014 |
| WO | 2015060185 A1 | 4/2015 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2016059207 A1 | 4/2016 |
| WO | 2016060058 A1 | 4/2016 |
| WO | 2016060063 A1 | 4/2016 |
| WO | 2015073921 A8 | 5/2016 |
| WO | 2016104098 A1 | 6/2016 |
| WO | 2016128384 A1 | 8/2016 |
| WO | 2016131061 A1 | 8/2016 |
| WO | 2016170989 A1 | 10/2016 |
| WO | 2017172536 A1 | 10/2017 |
| WO | 2017208807 A1 | 12/2017 |
| WO | 2018048925 A1 | 3/2018 |
| WO | 2018111751 A1 | 6/2018 |
| WO | 2018170010 A1 | 9/2018 |
| WO | 2018197702 A1 | 11/2018 |
| WO | 2019036587 A1 | 2/2019 |
| WO | 2019040949 A1 | 2/2019 |
| WO | 2019099102 A1 | 5/2019 |
| WO | 2019099870 A1 | 5/2019 |
| WO | 2019185423 A1 | 10/2019 |
| WO | 2019225184 A1 | 11/2019 |
| WO | 2019239872 A1 | 12/2019 |
| WO | 2019244697 A1 | 12/2019 |
| WO | 2019244698 A1 | 12/2019 |
| WO | 2019244734 A1 | 12/2019 |
| WO | 2019245729 A1 | 12/2019 |
| WO | 2020004048 A1 | 1/2020 |
| WO | 2020017328 A1 | 1/2020 |
| WO | 2020022318 A1 | 1/2020 |
| WO | 2020022319 A1 | 1/2020 |
| WO | 2020026802 A1 | 2/2020 |
| WO | 2020036806 A1 | 2/2020 |
| WO | 2020037331 A1 | 2/2020 |
| WO | 2020046561 A1 | 3/2020 |
| WO | 2020051064 A1 | 3/2020 |
| WO | 2020112921 A1 | 6/2020 |
| WO | 2020121819 A1 | 6/2020 |
| WO | 2020145051 A1 | 7/2020 |
| WO | 2021003319 A1 | 1/2021 |
| WO | 2021062223 A1 | 4/2021 |
| WO | 2021097459 A1 | 5/2021 |
| WO | 2021134000 A1 | 7/2021 |

OTHER PUBLICATIONS

Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.

PCT Notification of Transmittal of the International Search Report and the Written Opinion of the International Searching Authority for International Application No. PCT/US2019/048392; dated Dec. 16, 2019; 13 pages.

Eagle Harbor Technologies presentation by Dr Kenneth E Miller—"The EHT Integrated Power Module (IPM): An IGBT-Based, High Current, Ultra-Fast, Modular, Programmable Power Supply Unit," Jun. 2013, 21 pages.

Eagle Harbor Technologies presentation by Dr. Kenneth E. Miller—"The EHT Long Pulse Integrator Program, TPA Diagnostic Meeting, General Atomics," Jun. 4-7, 2013, 18 pages.

Eagle Harbor Technologies webpage—"In Situ Testing of EHT Integrators on a Tokamak," 2015, 1 page.

Eagle Harbor Technologies webpage—High Gain and Frequency Ultra-Stable Integrators for Long Pulse and/or High Current Applications, 2018, 1 page.

Eagle Harbor Technologies webpage—"EHT Integrator Demonstration at DIII-D," 2015, 1 page.

Eagle Harbor Technologies webpage—"High Gain and Frequency Ultra-Stable Integrators for ICC and Long Pulse ITER Applications," 2012, 1 page.

Eagle Harbor Technologies webpage—"Long-Pulse Integrator Testing with DIII-D Magnetic Diagnostics," 2016, 1 page.

Sunstone Circuits—"Eagle Harbor Tech Case Study," date unknown, 4 pages.

Wang, S.B., et al. —"Control of ion energy distribution at substrates during plasma processing," Journal of Applied Physics, vol. 88, No. 2, Jul. 15, 2000, pp. 643-646.

Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.

Richard Barnett et al. A New Plasma Source for Next Generation MEMS Deep Si Etching: Minimal Tilt, Improved Profile Uniformity and Higher Etch Rates, SPP Process Technology Systems. 2010.

Prager, J.R., et al.—"A High Voltage Nanosecond Pulser with Variable Pulse Width and Pulse Repetition Frequency Control for Nonequilibrium Plasma Applications," IEEE 41st International Con-

(56) References Cited

OTHER PUBLICATIONS ference on Plasma Sciences (ICOPS) held with 2014 IEEE International Conference on High-Power Particle Beams (BEAMS), pp. 1-6, 2014.
Semiconductor Components Industries, LLC (SCILLC)—"Switch-Mode Power Supply" Reference Manual, SMPSRM/D, Rev. 4, Apr. 2014, ON Semiconductor, 73 pages.
Zhuoxing Luo, B.S., M.S, "RF Plasma Etching With A DC Bias" A Dissertation in Physics. Dec. 1994.
Lin, Jianliang, et al.—"Diamond like carbon films deposited by HiPIMS using oscillatory voltage pulses," Surface & Coatings Technology 258, 2014, published by Elsevier B.V., pp. 1212-1222.
Yiting Zhang et al. "Investigation of feature orientation and consequences of ion tilting during plasma etching with a three-dimensional feature profile simulator", Nov. 22, 2016.
Michael A. Lieberman, "Principles of Plasma Discharges and Material Processing", A Wiley Interscience Publication. 1994.
Zhen-hua Bi et al., A brief review of dual-frequency capacitively coupled discharges, Current Applied Physics, vol. 11, Issue 5, Supplement, 2011, pp. S2-S8.
Chang, Bingdong,"Oblique angled plasma etching for 3D silicon structures with wiggling geometries" 31(8), [085301]. https://doi.org/10.1088/1361-6528/ab53fb. DTU Library. 2019.
Michael A. Lieberman, "A short course of the principles of plasma discharges and materials processing", Department of Electrical Engineering and Computer Sciences University of California, Berkeley, CA 94720.
Dr. Steve Sirard, "Introduction to Plasma Etching", Lam Research Corporation. 64 pages.
The International Search Report and the Written Opinion for International Application No. PCT/US2021/040380; dated Oct. 27, 2021; 10 pages.
International Search Report and Written Opinion dated Feb. 4, 2022 for Application No. PCT/US2021/054806.
International Search Report and Written Opinion dated Feb. 4, 2022 for Application No. PCT/US2021/05481.
U.S. Appl. No. 17/346,103, filed Jun. 11, 2021.
U.S. Appl. No. 17/349,763, filed Jun. 16, 2021.
U.S. Appl. No. 63/242,410, filed Sep. 9, 2021.
U.S. Appl. No. 17/410,803, filed Aug. 24, 2021.
U.S. Appl. No. 17/537,107, filed Nov. 29, 2021.
U.S. Appl. No. 17/352,165, filed Jun. 18, 2021.
U.S. Appl. No. 17/352,176, filed Jun. 18, 2021.
U.S. Appl. No. 17/337,146, filed Jun. 2, 2021.
U.S. Appl. No. 17/361,178, filed Jun. 28, 2021.
U.S. Appl. No. 63/210,956, filed Jun. 15, 2021.
U.S. Appl. No. 17/475,223, filed Sep. 14, 2021.
U.S. Appl. No. 17/537,314, filed Nov. 29, 2021.
Chinese Office Action for 201880053380.1 dated Dec. 2, 2021.
Taiwan Office Action for 108132682 dated Mar. 24, 2022.
PCT International Search Report and Written Opinion dated Nov. 9, 2018, for International Application No. PCT/US2018/043032.
Taiwan Office Action for Application No. 107125613 dated Dec. 24, 2020, 16 pages.
PCT International Search Report and Written Opinion dated Nov. 7, 2018, for International Application No. PCT/US2018/042965.
International Search Report and Written Opinion for PCT/US2019/052067 dated Jan. 21, 2020.
PCT International Search Report and Written Opinion dated Nov. 7, 2018, for International Application No. PCT/US2018/042961.
PCT International Search Report and Written Opinion dated Nov. 7, 2018, for International Application No. PCT/US2018/042956.
U.S. Appl. No. 62/433,204; entitled Creating Arbitrarily-Shaped Ion Energy Distribution Function (IEDF) Using Shaped-Pulse (EV) Bias; by Leonid Dorf, et al.; filed Dec. 16, 2016; 22 total pages.
U.S. Appl. No. 15/424,405; entitled System for Tunable Workpiece Biasing in a Plasma Reactor; by Travis Koh, et al. filed Feb. 3, 2017; 29 total pages.
U.S. Appl. No. 15/618,082; entitled Systems and Methods for Controlling a Voltage Waveform at a Substrate During Plasma Processing; by Leonid Dorf, et al.; filed Jun. 8, 2017; 35 total pages.
PCT Notification of Transmittal of the International Search Report and the Written Opinion of the International Searching Authority for International Application No. PCT/US2018/046171; dated Nov. 28, 2018; 10 total pages.
PCT Notification of Transmittal of the International Search Report and the Written Opinion of the International Searching Authority for International Application No. PCT/US2018/046182; dated Nov. 30, 2018; 10 total pages.
Eagle Harbor Technologies presentation by Dr. Kenneth E. Miller-"The EHT Long Pulse Integrator Program," ITPA Diagnostic Meeting, General Atomics, Jun. 4-7, 2013, 18 pages.
PCT/US2020/014453 Interanational Search Report and Written Opinion dated May 14, 2020 consists of 8 pages.
Korean Office Action for 10-2020-7007495 dated Jun. 14, 2021.

* cited by examiner

AUTOMATIC ESC BIAS COMPENSATION WHEN USING PULSED DC BIAS

BACKGROUND

Field

Embodiments of the present disclosure generally relate to a system used in semiconductor manufacturing. More specifically, embodiments of the present disclosure relate to a system for biasing and clamping a substrate.

Description of the Related Art

Ion bombardment is often used as a source of activation energy for chemical and physical processes in plasma etch and plasma enhanced chemical vapor deposition (PECVD) processes for processing a semiconductor substrate. High energy ions accelerated by plasma sheath are also highly directional and can be used for etching high aspect ratio features. Conventionally, a substrate may be biased using radio frequency (RF) power from an RF source. The RF source supplies an RF voltage to a first electrode embedded in an electrostatic chuck (ESC). The first electrode is capacitively coupled to the plasma of a processing system through a layer of ceramic, which is a part of the ESC. Non-linear, diode-like nature of the plasma sheath results in rectification of the applied RF field, such that a direct-current (DC) voltage drop, or self-bias, appears between the substrate and the plasma. This voltage drop determines the average energy of the ions accelerated towards the substrate.

The ESC secures the substrate disposed thereon by applying a fixed DC voltage to a second electrode embedded in the ESC to establish an electric field between the ESC and the substrate. The electric field induces opposite polarity charges to accumulate on the substrate and the second electrode, respectively. The electrostatic attractive force between the oppositely polarized charges pulls the substrate toward the ESC to secure the substrate. However, the electrostatic force can be affected by the RF bias power supplied to the first electrode in the ESC, leading to under or over clamping of the substrate. In addition, as large bias voltage become many kilovolts, the fluctuation of the self-bias voltage with respect to the fixed DC voltage can lead to an increase the risk of arcing or sudden de-clamping and breaking of the substrate. This is particularly a problem with very high bias power (kilovolts (kV) range) which is pulsing.

Therefore, an improved system for biasing and clamping a substrate is needed.

SUMMARY

Embodiments of the present disclosure generally relate to a system used in semiconductor manufacturing. More specifically, embodiments of the present disclosure relate to a system for pulsed DC biasing and clamping a substrate. In one embodiment, a system includes a plasma process chamber and a biasing and clamping circuit coupled to the plasma process chamber. The biasing and clamping circuit includes a first shaped DC pulse voltage source and a clamping network connected in parallel to the shaped DC pulse voltage source. The clamping network includes a DC voltage source and a diode.

In another embodiment, a system includes a plasma process chamber and a biasing and clamping circuit coupled to the plasma process chamber. The biasing and clamping circuit is configured to provide pulsed biasing voltage and constant clamping voltage to a substrate disposed in the plasma process chamber.

In another embodiment, a method includes pulsed DC biasing and clamping a substrate disposed on an electrostatic chuck disposed in a plasma process chamber. The substrate is clamped at a substantially constant voltage. The pulsed DC biasing and clamping the substrate includes providing a first voltage to the substrate, the first voltage being pulsed, and providing a second voltage to an electrode embedded in the electrostatic chuck. The substantially constant voltage is a difference between the first voltage and the second voltage.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a system used in semiconductor manufacturing. More specifically, embodiments of the present disclosure relate to a system for biasing and clamping a substrate. In one embodiment, the system includes a plasma chamber having an ESC for supporting a substrate. An electrode is embedded in the ESC and is electrically coupled to a biasing and clamping circuit. The biasing and clamping circuit includes at least a shaped DC pulse voltage source and a clamping network. The clamping network includes a DC voltage source and a diode. The shaped DC pulse voltage source and the clamping network are connected in parallel. The clamping network automatically maintains a substantially constant clamping voltage, which is a constant voltage drop across the electrode and the substrate when the substrate is biased with pulsed DC voltage, leading to improved clamping of the substrate.

Figure 1:
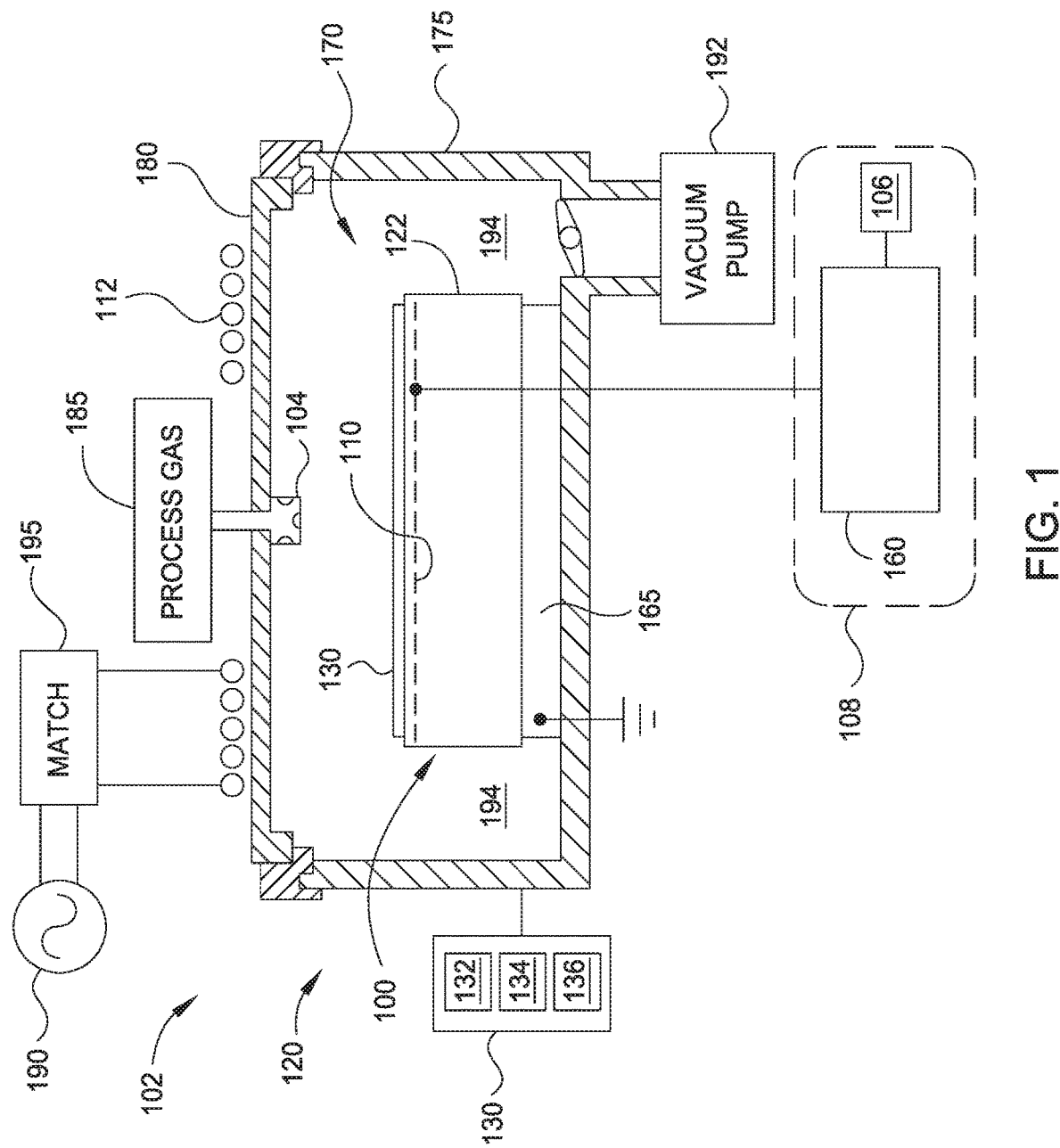
FIG. 1 is a schematic cross sectional view of a system for biasing and clamping a substrate.

FIG. 1 is a schematic cross sectional view of a system 102 for biasing and clamping a substrate. The system 102 includes a plasma process chamber 120 and a biasing and clamping circuit 108. In one embodiment, which can include or be combined with one or more embodiments described herein, as shown in FIG. 1, the plasma process chamber 120 is a reactive ion etch (RIE) plasma chamber. In some embodiments, the plasma process chamber 120 is PECVD chamber, a plasma enhanced physical vapor deposition (PEPVD) chamber, or a plasma enhanced atomic layer deposition (PEALD) chamber. In some embodiments, the plasma process chamber 120 is a plasma treatment chamber, or a plasma based ion implant chamber, for example a plasma doping (PLAD) chamber. Herein, the plasma process chamber 120 includes a plasma source 112, such as an inductively coupled plasma (ICP) source, electrically coupled to an RF power supply 190. In some embodiments, the plasma source 112 is a capacitively coupled plasma (CCP) source, such as a plasma electrode disposed in the processing volume facing the substrate support where the plasma electrode is electrically coupled to an RF power supply.

The plasma process chamber 120 includes a chamber body 175 and a chamber lid 180 defining a processing volume 170. One or more process gases are introduced into the processing volume 170 from a process gas source 185 via a nozzle 104. The plasma source 112, which is one or more inductive coils in one embodiment, is disposed over the chamber lid 180 outside of the processing volume 170. The plasma source 112 is electrically coupled to the RF power supply 190 via an RF matching circuit 195. The RF power supply 190 and the plasma source 112 are used to ignite and maintain a plasma using the processing gases and inductive energy in the processing volume 170. The processing volume 170 is fluidly coupled to one or more vacuum pumps 192, through a vacuum outlet 194, which maintain the processing volume 170 at sub-atmospheric conditions and evacuate processing, and/or other gases, therefrom. A substrate support assembly 100 is disposed in the processing volume 170. The substrate support assembly 100 includes an ESC 122 for supporting and securing a substrate 130. The ESC 122 is disposed on one or more layers 165.

In some embodiments, the one or more layers 165 include one or more fluid conduits (not shown) disposed therein that are fluidly coupled to, and in fluid communication with, a coolant source (not shown), such as a refrigerant source or water source having relatively high electrical resistance to control the temperature of the substrate support assembly 100. The ESC 122 is formed of a dielectric material, such as a bulk sintered ceramic material, such as a corrosion resistant metal oxide or metal nitride material, for example aluminum oxide ($Al_2O_3$), aluminum nitride (AlN), titanium oxide (TiO), titanium nitride (TiN), yttrium oxide ($Y_2O_3$), mixtures thereof, or combinations thereof. The ESC 122 includes an electrode 110 embedded therein. The electrode 110 is utilized for both biasing and clamping the substrate 130. The electrode 110 is formed of an electrically conductive material, such as one or more metal meshes, foils, plates, or combinations thereof.

The electrode 110 is electrically coupled to the biasing and clamping circuit 108. The biasing and clamping circuit 108 includes a shaped DC pulse voltage source 106 and a clamping network 160. The clamping network 160 automatically maintains a substantially constant clamping voltage, which is a constant voltage drop across the electrode 110 and the substrate 130 when the substrate 130 is biased with pulsed DC voltage by the shaped DC pulse voltage source 106, leading to improved clamping of the substrate. The biasing and clamping circuit 108 is described in detail in FIGS. 2, 4, 5, and 6.

The system 102 further includes a system controller 130. The system controller 130 includes a central processing unit (CPU) 132, a memory 134, and support circuits 136. The system controller 130 is used to control the process sequence used to process the substrate 130 including the substrate biasing and clamping described herein. The CPU 132 is a general purpose computer processor configured for use in an industrial setting for controlling the system 102 and sub-processors related thereto. The memory 134 includes random access memory, read only memory, floppy or hard disk drive, or other suitable forms of digital storage, local or remote. The support circuits 136 are coupled to the CPU 132 and include cache, clock circuits, input/output subsystems, power supplies, and the like, and combinations thereof. In some embodiments, the system controller 130 further includes one or more computer readable media (not shown).

Computer readable media includes any device, located either locally or remotely from the system controller 130, which is capable of storing information that is retrievable by a computing device. Examples of computer readable media useable with embodiments of the present disclosure include solid state memory, floppy disks, internal or external hard drives, and optical memory (CDs, DVDs, BR-D, etc). In one embodiment, which can include or be combined with one or more embodiments described herein, the computer readable media includes the memory 134. Software routines, when executed by the CPU 132, transform the CPU 132 into a specific purpose computer, herein the system controller 130, that controls the operation of the system 102, such that the processes are performed in accordance with embodiments of the disclosure. In some embodiments, the software routines are stored and/or executed by a second controller (not shown) that is located remotely from the system 102. In some embodiments, the processes described herein, or portions thereof, are performed by one or more application specific integrated circuits (ASIC) or other types of hardware implementations. In some embodiments, the processes described herein are performed by a combination of software routines, ASIC(s), and/or other types of hardware implementations. The software routines, which are stored within the memory, include program code that may be executed by the CPU 132 in order to perform various functionalities associated with the bias and clamping schemes and methods described herein.

Figure 2:
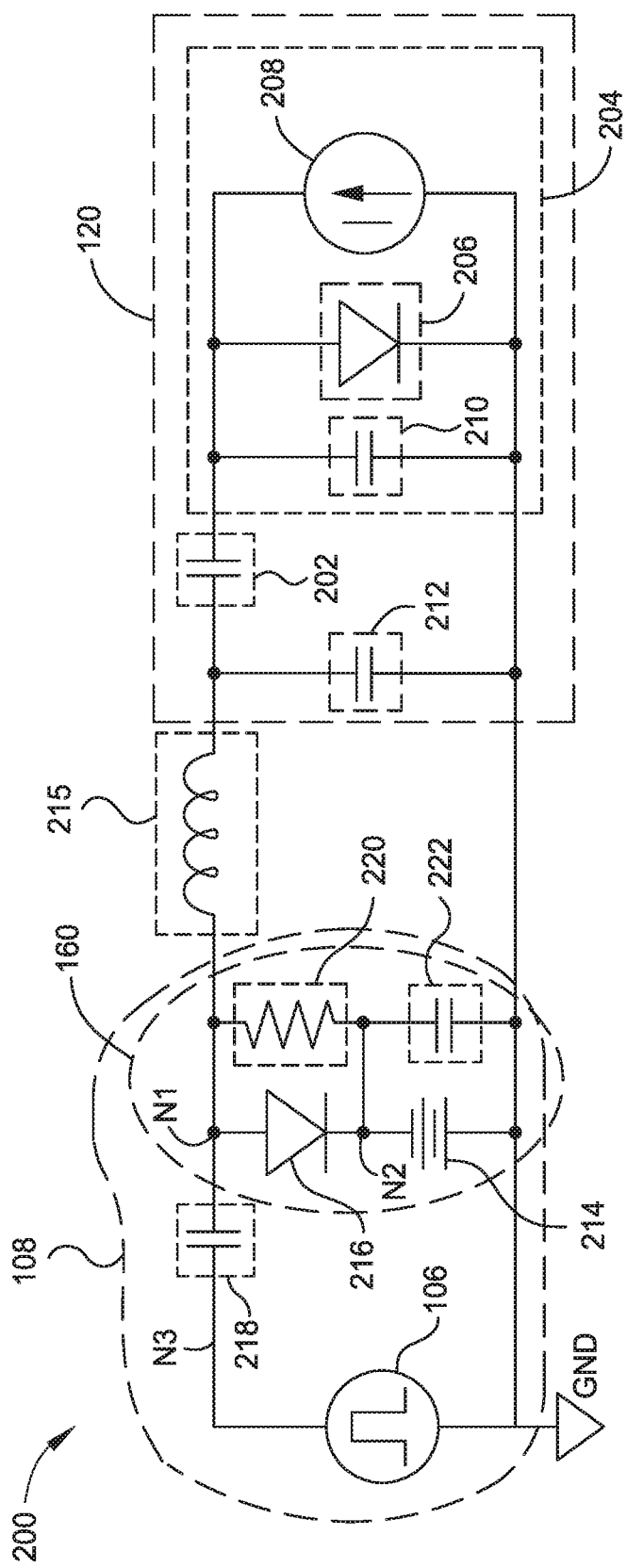
FIG. 2 is a schematic circuit diagram of a biasing and clamping scheme for a process performed in the system of FIG. 1.

FIG. 2 is a schematic circuit diagram of a biasing and clamping scheme for a process performed in the system 102 of FIG. 1. The circuit 200 shown in the circuit diagram is used to model the main aspects of the interaction of the biasing and clamping circuit 108 and the plasma process chamber 120. In practice, interaction of the biasing and clamping scheme described herein with the plasma in the processing volume 170 (as shown in FIG. 1) may be accompanied by complex physical phenomena.

As shown in FIG. 2, the circuit 200 includes components located within the plasma process chamber 120 and components located within the biasing and clamping circuit 108. The electrode 110 (as shown in FIG. 1), the dielectric material of the ESC 122 (as shown in FIG. 1), and the substrate 130 (as shown in FIG. 1) are represented in the circuit 200 by a capacitor 202. The plasma sheath 204 formed in the processing region 170 (as shown in FIG. 1) is represented in the circuit 200 by a 3-part circuit element including: a) a diode 206, which when conducting represents the plasma sheath collapse, b) a current source 208, which represents the ion current flowing in the presence of the plasma sheath, and c) a capacitor 210, which represents the plasma sheath for the main portion of the biasing and clamping cycle (~90%), i.e., ion current phase, during which the ion acceleration and etching (or deposition) occur.

The biasing and clamping circuit 108, the electrode 110 (as shown in FIG. 1), and the external electrical conductor (such as an electrical cable) connecting the biasing and clamping circuit 108 and the electrode 110 together have some combined parasitic capacitance to ground, which is represented in the circuit 200 by a parasitic capacitor 212. The external electrical conductor may be a coaxial transmission line, which is represented in the circuit 200 by an inductor 215.

The biasing and clamping circuit 108 includes the shaped DC pulse voltage source 106 and the clamping network 160, as shown in FIG. 2. The shaped DC pulse voltage source 106 is connected between a node N3 and a ground node GND. A capacitor 218 is further connected between the node N3 and a node N1. The clamping network 160 includes at least a diode 216, a capacitor 222, a DC voltage source 214, and a resistor 220. The clamping network 160 is also connected between the node N1 and the ground node GND. The diode 216 and the resistor 220 are connected between the node N1 and a node N2, and the DC voltage source 214 and the capacitor 222 are connected between the node N2 and the ground node GND. The shaped DC pulse voltage source 106, or a pulsed bias generator, is used to establish a pulsed bias voltage waveform at the electrode 110 (as shown in FIG. 1). The DC voltage source 214 and the diode 216 are used to establish a substantially constant clamping voltage, which is a voltage difference across the capacitor 202 (e.g., across the electrode 110, the dielectric material of the ESC 122, and the substrate 130 (as shown in FIG. 1)).

Figure 3A:
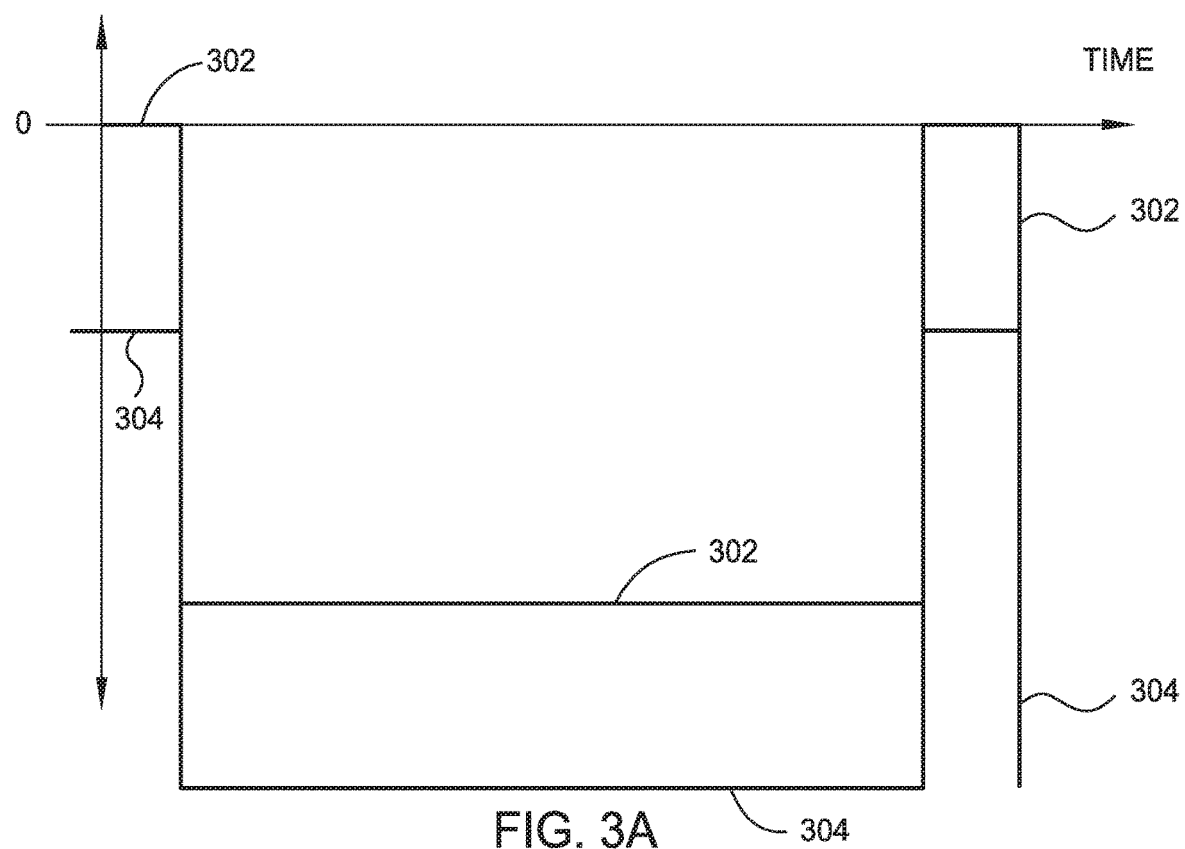
FIGS. 3A and 3B illustrate voltage waveforms by the circuit of FIG. 2.

FIG. 3A illustrates a first voltage waveform 302 and a second voltage waveform 304 using the circuit 200 of FIG. 2. Referring to FIGS. 2 and 3A, during operation of the system 102 (as shown in FIG. 1), the first voltage waveform 302 is the voltage at the substrate 130 (as shown in FIG. 1). The peak voltage of the first voltage waveform 302 is set to equal to the voltage on the surface of the substrate 130 (as shown in FIG. 1) from the plasma. The second voltage waveform 304 is the voltage at the electrode 110 (as shown in FIG. 1). With the diode 216, the second voltage waveform 304 automatically tracks the first voltage waveform 302. The presence of the diode 216 maintains a constant voltage difference between the first and second waveforms 302, 304. As shown in FIG. 3A, the first voltage waveform 302 and the second voltage waveform 304 have a constant difference, which is the constant clamping voltage across the electrode 110, the dielectric material of the ESC 122, and the substrate 130. In other words, the constant clamping voltage is the difference between the first voltage waveform 302 and the second voltage waveform 304.

For example, the shaped DC pulse voltage source 106 is set to provide pulses of DC voltage from 0 kV to −4 kV and the DC voltage source 214 is set to provide a constant DC voltage at −2 kV. When the first voltage waveform 302 is at 0 kV (i.e., a high state), the second voltage waveform 304 is at −2 kV because the diode 216 is conducting. A voltage drop of −2 kV is built up across the capacitor 218 (the voltage at the node N3 is 2 kV higher than that at node N1). When the first voltage waveform 302 is then changed from 0 kV to −4 kV (i.e., a low state), due to the voltage drop of 2 kV across the capacitor 218, the voltage at node N1, which is essentially the second voltage waveform 304, changes to −6 kV. The diode 216 is not conducting at this moment because the diode 216 is reverse-biased. When the first voltage waveform 302 changes back to 0 kV from −4 kV, the diode 216 is conducting again, setting the voltage waveform 304 at the electrode 110 back to −2 kV. Thus, bias compensation of the clamping voltage is automatically performed by the shaped DC pulse voltage source 106, the diode 216, and the DC voltage source 214. In some embodiments, the shaped DC pulse voltage source 106 can provide shaped DC pulses which have more complicated waveform than the voltage waveform 302 shown in FIG. 3A, and an example is shown in FIG. 3B.

Figure 3B:
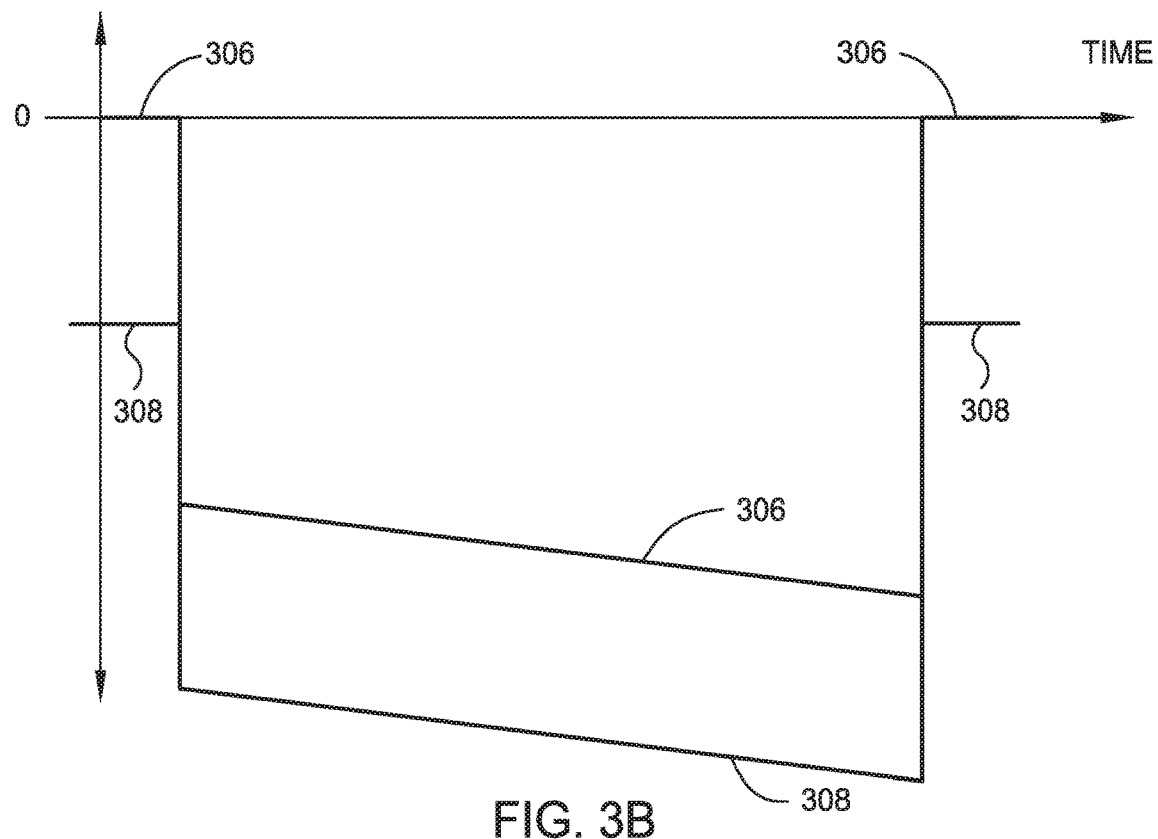
Figure 4:
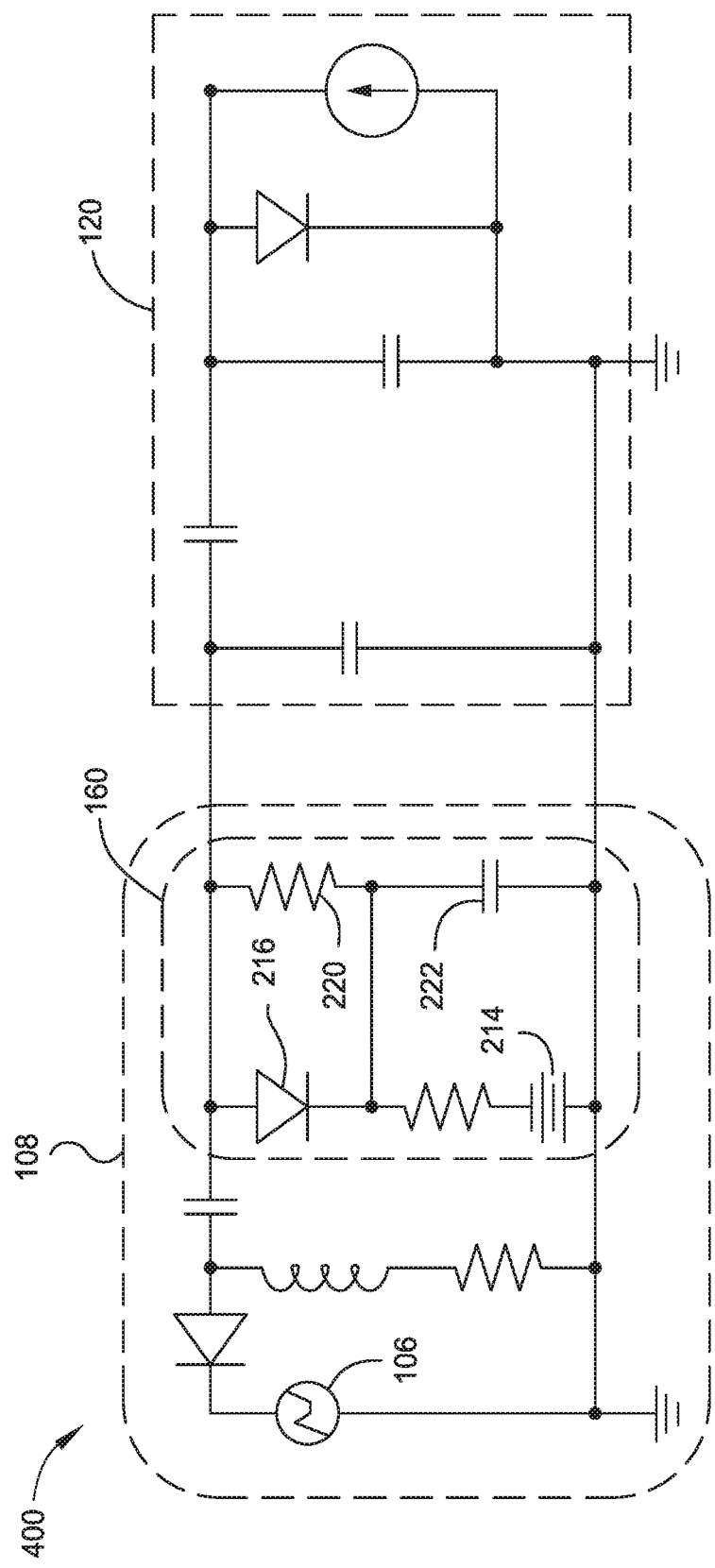
FIGS. 4-7 are schematic circuit diagrams of a biasing and clamping scheme for a process performed in the system of FIG. 1.

FIG. 3B illustrates a first voltage waveform 306 and a second voltage waveform 308 using the circuit 200 of FIG. 2. Referring to FIGS. 2 and 3B, during operation of the system 102 (as shown in FIG. 1), the first voltage waveform 306 is the voltage at the substrate 130 (as shown in FIG. 1). The peak voltage of the first voltage waveform 306 is set to equal to the voltage on the surface of the substrate 130 (as shown in FIG. 1) from the plasma. The second voltage waveform 308 is the voltage at the electrode 110 (as shown in FIG. 1). With the diode 216, the second voltage waveform 308 automatically tracks the first voltage waveform 306. The presence of the diode 216 maintains a constant voltage difference between the first and second waveforms 306, 308. As shown in FIG. 3B, the first voltage waveform 306 and the second voltage waveform 308 have a constant difference, which is the constant clamping voltage across the electrode 110, the dielectric material of the ESC 122, and the substrate 130. In other words, the constant clamping voltage is the difference between the first voltage waveform 306 and the second voltage waveform 308.

Figure 5:
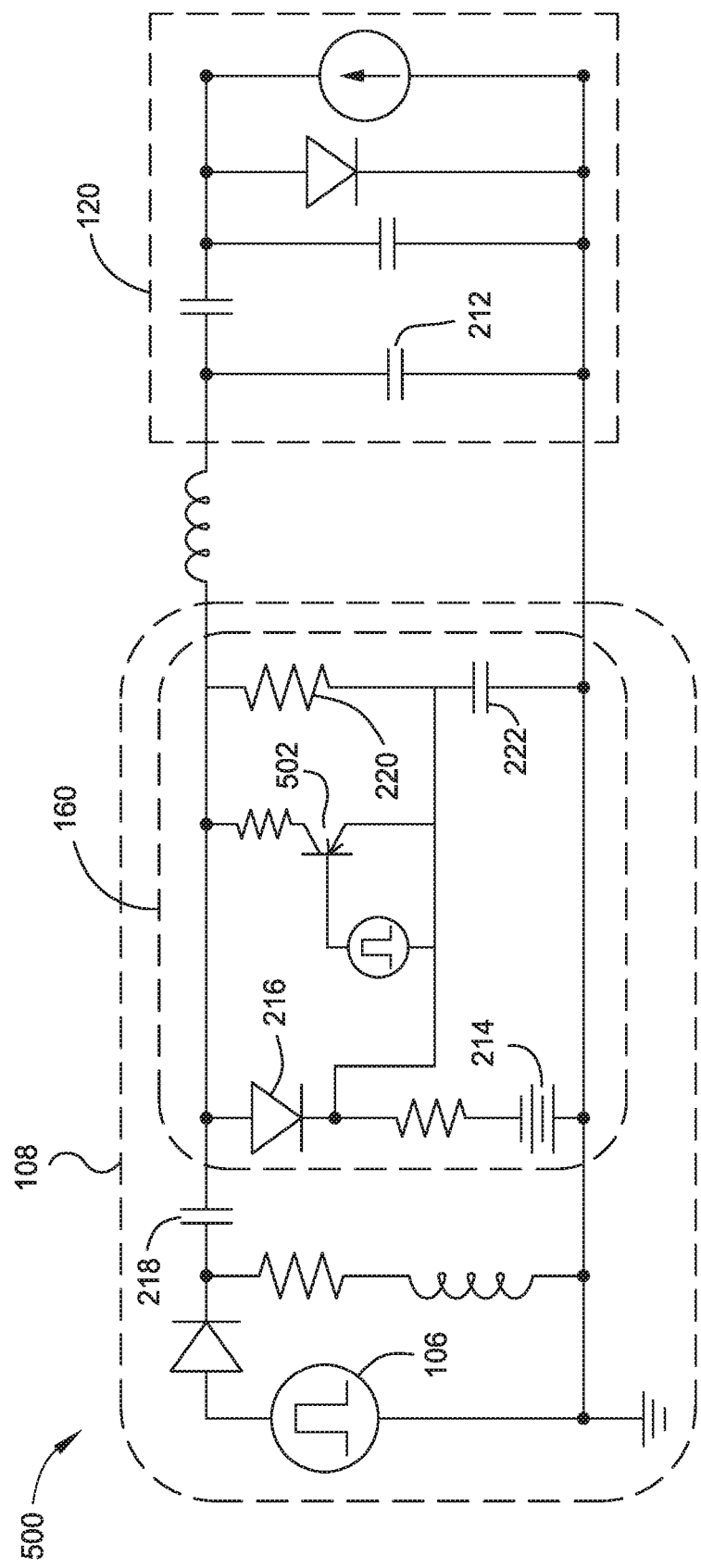

FIGS. 4-7 are schematic circuit diagrams of a biasing and clamping scheme for a process performed in the system of FIG. 1. Circuits 400, 500, 600, and 700 include components in the plasma process chamber 120 and components in the biasing and clamping circuit 108. In some embodiments, the shaped DC pulse voltage source 106 outputs bursts of a plurality of short positive pulses rather than bursts of long negative pulses. In this case, over clamping between bursts can occur because the voltage waveform 302 (as shown in FIG. 3A) stops at the more negative voltage state. Then the substrate can get discharged by an ion current from the current source 208 (as shown in FIG. 2) and the voltage waveform 302 returns to 0 kV. However, the electrode 110 takes longer time to discharge compared to the substrate because of the RC time constant of the resistor 220 and the capacitors 202, 212, and 218. As a result, the voltage magnitude of the voltage waveform 304 remains high and over clamping of the substrate occurs. Circuits 500, 600, and 700 provide a solution to avoid long discharge time at the end of each burst of pulses. As shown in FIG. 5, the circuit 500 includes the biasing and clamping circuit 108 having a switch 502. At the end of each burst, the switch 502 is turned on to discharge the capacitors 218 and 212 in the circuit 500.

Figure 6:
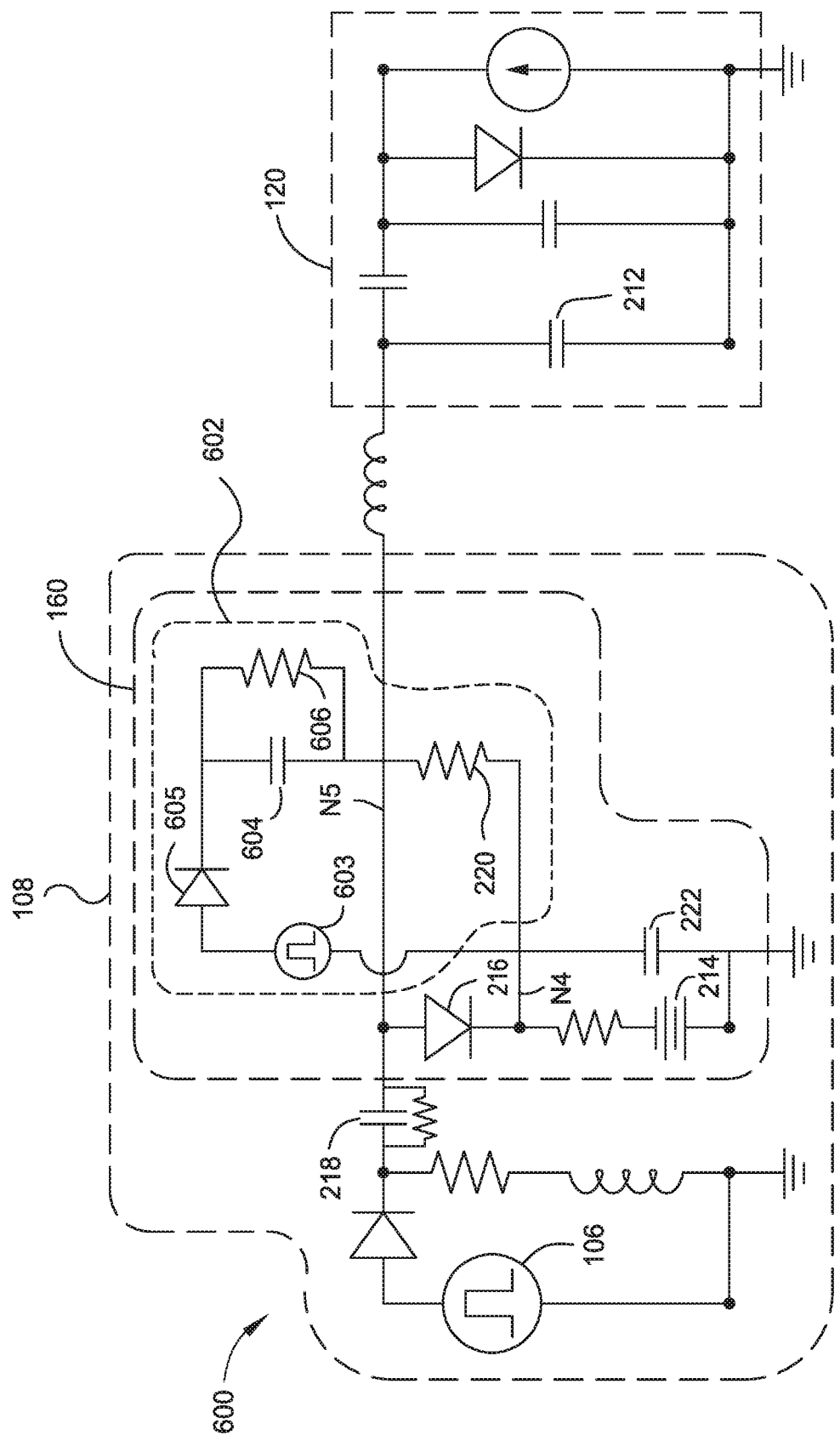

As shown in FIG. 6, the circuit 600 includes the biasing and clamping circuit 108 having a shaped DC pulse voltage source network 602 that is utilized to reduce over clamping between bursts. At the end of each burst, or between bursts of pulses, a second shaped DC pulse voltage source 603 turns on to pump the excess charge from the capacitors 202, 212, and 218 to the capacitor 604, so that the charge remained in the capacitors 202, 212, and 218 are just enough to maintain the predetermined clamping voltage at the electrode 110. As shown in FIG. 6, the diode 216 is connected between the node N4 and the node N5, and the DC voltage source 214 is connected between the node N4 and the ground node. The shaped DC pulse voltage source network 602 is connected between the node N4 and the node N5. The shaped DC pulse voltage source network 602 includes serially connected shaped DC pulse voltage source 603, diode 605, and an impedance (e.g., the capacitor 604 and the resistor 606).

Figure 7:
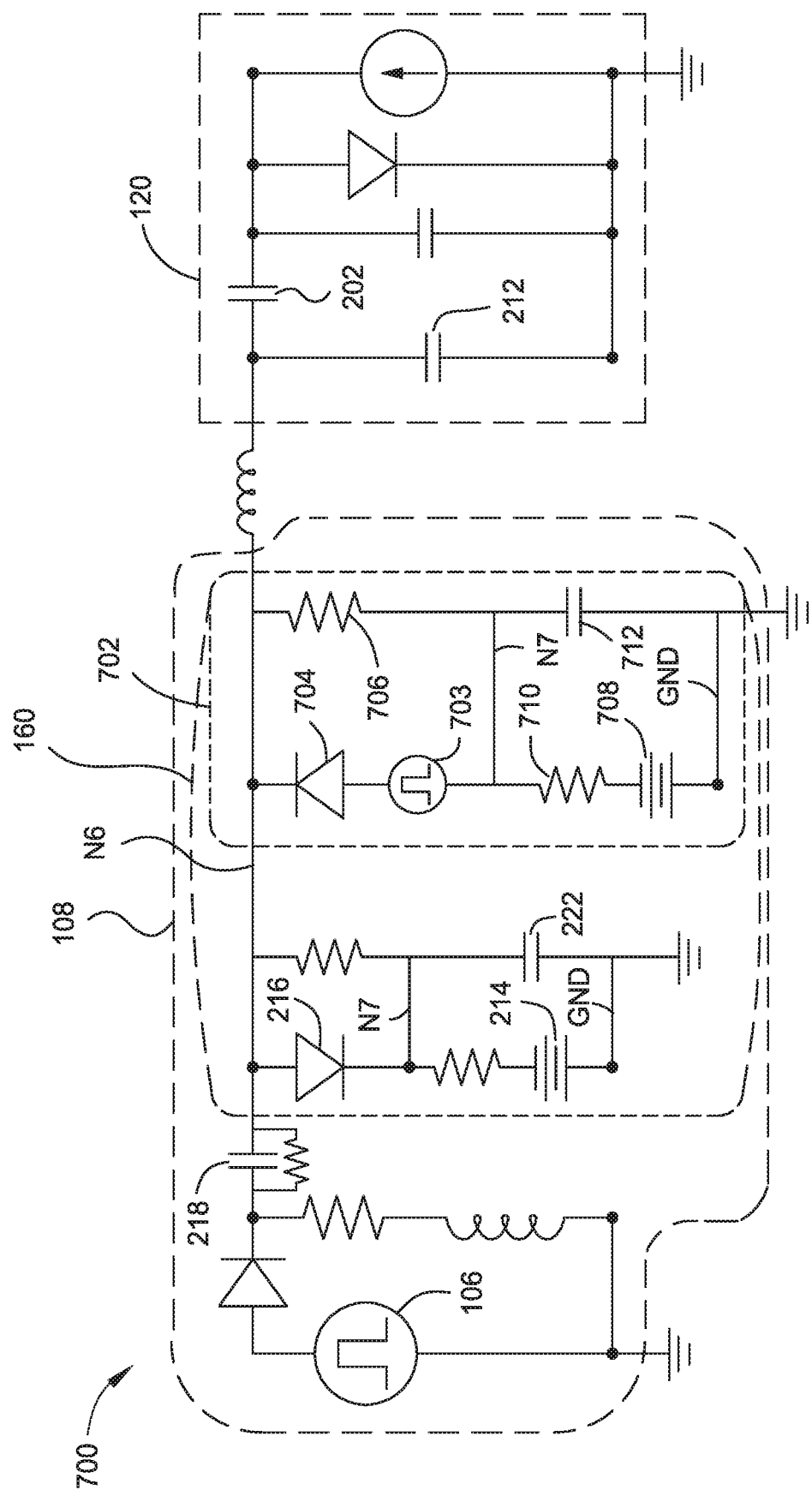

Similarly, as shown in FIG. 7, the circuit 700 includes the biasing and clamping circuit 108 having a shaped DC pulse voltage source network 702 that is utilized to reduce over clamping between bursts. At the end of each burst, a second shaped DC pulse voltage source 703 turns on to discharge the excess charge stored in the capacitors 202, 212, and 218. Using one of the circuits 500, 600, and 700, the clamping voltage can remain constant during both burst on and burst off states. As shown in FIG. 7, the diode 216 is connected between the node N6 and the node N7, and the DC voltage source 214 is connected between the node N7 and the ground node. The shaped DC pulse voltage source network 702 is connected between the node N6 and the ground node. The shaped DC pulse voltage source network 702 includes the shaped DC pulse voltage source 703, a diode 704, a resistor 706, a DC voltage source 708, a resistor 710, and a capacitor 712. The shaped DC pulse voltage source 703, the diode 704, and the resistor 706 are connected between the node N6 and the node N7, and the DC voltage source 708, the resistor 710, and the capacitor 712 are connected between the node N7 and the ground node.

The biasing and clamping circuit automatically maintains a substantially constant clamping voltage on the substrate when the substrate is biased with pulsed DC voltage, leading to improved clamping of the substrate. The biasing and clamping circuit includes the DC voltage source, the diode, the capacitor, and the shaped DC pulse voltage source. The diode causes the voltage at the electrode to track the pulsed biasing voltage. As a result, the clamping voltage on the substrate is substantially constant.

While the foregoing is directed to embodiments of the present disclosure, other and further embodiments of the disclosure may be devised without departing from the basic scope thereof, and the scope thereof is determined by the claims that follow.

What is claimed is:

1. A system, comprising:
   a plasma process chamber; and
   a biasing and clamping circuit coupled to the plasma process chamber, the biasing and clamping circuit comprising:
   a first shaped direct current (DC) pulse voltage source; and
   a clamping network connected in parallel to the first shaped DC pulse voltage source, the clamping network comprising:
   a second DC voltage source coupled to a ground node and coupled to a first node, wherein the second DC voltage source is further directly coupled in series to a second node;
   a diode directly coupled to the first node and directly coupled to the second node; and
   a resistor coupled to the first node and the second node and in parallel with the diode.

2. The system of claim 1, wherein the plasma process chamber comprises:
   a chamber body;
   a chamber lid, wherein the chamber body and the chamber lid define a processing volume; and
   a substrate support assembly disposed in the processing volume.

3. The system of claim 2, wherein the substrate support assembly comprises an electrostatic chuck, wherein the electrostatic chuck comprises a dielectric material and an electrode embedded in the dielectric material, wherein the first shaped DC pulse voltage source and the clamping network are connected to the electrode.

4. The system of claim 2, wherein the biasing and clamping circuit is configured to provide a pulsed biasing voltage and constant clamping voltage to a substrate disposed in the plasma process chamber.

5. The system of claim 1, wherein the biasing and clamping circuit further comprises a second shaped DC pulse voltage source.

6. The system of claim 1, wherein the biasing and clamping circuit further comprises a switch.

7. A system, comprising:
   a plasma process chamber; and
   a biasing and clamping circuit coupled to the plasma process chamber, the biasing and clamping circuit being configured to provide a pulsed biasing voltage and a constant clamping voltage to a substrate disposed in the plasma process chamber, wherein the biasing and clamping circuit comprises a clamping network comprising:
   a first direct-current (DC) voltage source coupled to a first node, wherein the first DC voltage source is further directly coupled in series to a second node;
   a first diode directly coupled to the second node;
   a first capacitor; and
   a first resistor coupled to the first node between the first diode and the first DC voltage source and in parallel with the first diode.

8. The system of claim 7, wherein the biasing and clamping circuit comprises:
   a first shaped DC pulse voltage source, and wherein the clamping network is connected in parallel to the first shaped DC pulse voltage source.

9. The system of claim 7, wherein the first diode is connected between the first node and a second node, and the first DC voltage source is connected between the first node and a ground node.

10. The system of claim 9, wherein the biasing and clamping circuit further comprises a first shaped DC pulse voltage source network, and wherein the first shaped DC pulse voltage source network is connected between the first node and the second node.

11. The system of claim 10, wherein the first shaped DC pulse voltage source network comprises a second shaped DC pulse voltage source, a second diode, and an impedance that are serially connected.

12. The system of claim 10, wherein the biasing and clamping circuit further comprises a second shaped DC pulse voltage source network, wherein the second shaped DC pulse voltage source network is connected between the first node and the ground node.

13. The system of claim 12, wherein the second shaped DC pulse voltage source network comprises a third shaped DC pulse voltage source, a third diode, a second resistor, a second direct-current voltage source, a third resistor, and a second capacitor, wherein the third shaped DC pulse voltage source, the third diode, and the second resistor are connected between the first node and the second node, and wherein the second direct-current voltage source, the third resistor, and the second capacitor are connected between the second node and the ground node.

14. A method, comprising:
   biasing and clamping, via a biasing and clamping circuit, a substrate disposed on an electrostatic chuck disposed in a plasma process chamber, the substrate being clamped at a substantially constant voltage, wherein biasing and clamping the substrate comprises:
   providing a first voltage to the substrate, the first voltage being pulsed; and providing a second voltage to an electrode embedded in the electrostatic chuck, the substantially constant voltage is a difference between the first voltage and the second voltage, wherein the biasing and clamping circuit comprises a clamping network comprising:
- a DC voltage source coupled to a ground node and a first node, wherein the DC voltage source is further directly coupled in series to a second node;
- a diode directly coupled to the first node and directly coupled to the second node; and
- a resistor coupled to the first node and the second node and in parallel with the diode.

15. The method of claim 14, wherein biasing and clamping the substrate is performed by a first shaped DC pulse voltage source and the clamping network, and the first voltage is provided by the first shaped DC pulse voltage source.

16. The method of claim 15, wherein the diode is conducting when the first voltage is at a high state and the diode is in a reverse-bias mode when the first voltage is at a low state.

17. The method of claim 15, wherein the first voltage comprises bursts of negative pulses.

18. The method of claim 15, wherein the first voltage comprises bursts of positive pulses.

19. The method of claim 18, wherein the clamping network further comprises a switch, and the switch is turned on between the bursts of positive pulses.

20. The method of claim 18, wherein the clamping network further comprises a second shaped DC pulse voltage source, and the second shaped DC pulse voltage source is turned on between the bursts of positive pulses.

* * * * *